United States Patent
Ohashi et al.

(10) Patent No.: US 10,208,184 B2
(45) Date of Patent: Feb. 19, 2019

(54) PHOTOSENSITIVE RESIN COMPOSITION AND ADHESIVES COMPOSITION

(71) Applicant: NISSAN CHEMICAL INDUSTRIES, LTD., Tokyo (JP)

(72) Inventors: Takuya Ohashi, Toyama (JP); Tetsuo Sato, Funabashi (JP); Mamoru Tamura, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 93 days.

(21) Appl. No.: 15/535,116

(22) PCT Filed: Dec. 14, 2015

(86) PCT No.: PCT/JP2015/084930
§ 371 (c)(1),
(2) Date: Jun. 12, 2017

(87) PCT Pub. No.: WO2016/104218
PCT Pub. Date: Jun. 30, 2016

(65) Prior Publication Data
US 2017/0342238 A1 Nov. 30, 2017

(30) Foreign Application Priority Data
Dec. 22, 2014 (JP) .................. 2014-258798

(51) Int. Cl.
| | |
|---|---|
| *C08K 5/103* | (2006.01) |
| *C08K 5/09* | (2006.01) |
| *C09J 175/16* | (2006.01) |
| *C08L 75/16* | (2006.01) |
| *G03F 7/027* | (2006.01) |
| *G03F 7/031* | (2006.01) |
| *C08G 18/62* | (2006.01) |
| *C08G 18/67* | (2006.01) |
| *C09J 4/06* | (2006.01) |
| *G03F 7/035* | (2006.01) |

(52) U.S. Cl.
CPC ............ *C08K 5/09* (2013.01); *C08G 18/6208* (2013.01); *C08G 18/672* (2013.01); *C08K 5/103* (2013.01); *C08L 75/16* (2013.01); *C09J 4/06* (2013.01); *C09J 175/16* (2013.01); *G03F 7/027* (2013.01); *G03F 7/031* (2013.01); *G03F 7/035* (2013.01)

(58) Field of Classification Search
CPC ........................................ C08K 5/09
USPC .................................. 528/44, 422
See application file for complete search history.

(56) References Cited

FOREIGN PATENT DOCUMENTS

| | | |
|---|---|---|
| JP | 2000-323692 A | 11/2000 |
| JP | 2002-309185 A | 10/2002 |
| JP | 2004-143233 A | 5/2004 |
| JP | 2014-080497 A | 5/2014 |
| JP | 2014-237734 A | 12/2014 |
| WO | 2013/031678 A1 | 3/2013 |
| WO | 2014/196415 A1 | 12/2014 |

OTHER PUBLICATIONS

Mar. 8, 2016 Written Opinion issued in International Patent Application No. PCT/JP2015/084930.
Mar. 8, 2016 Search Report issued in International Patent Application No. PCT/JP2015/084930.

*Primary Examiner* — Duc Truong
(74) *Attorney, Agent, or Firm* — Oliff PLC

(57) ABSTRACT

A photosensitive resin composition comprises a polymer having a repeating structural unit of the following Formula (1):

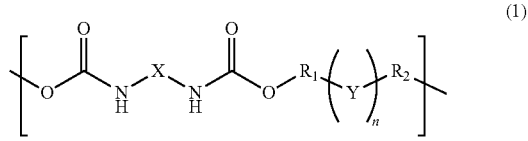

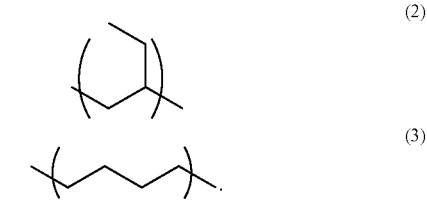

(wherein $R_1$ and $R_2$ are each independently a single bond, a methylene group, or an ethylene group, Y is an alkylene group of Formula (2) or a combination of the alkylene group of Formula (2) with an alkylene group of Formula (3), n is an integer of 1 to 110, and X is a divalent aliphatic hydrocarbon group, a divalent alicyclic hydrocarbon group, or a divalent aromatic hydrocarbon group) and a (meth) acryloyl group at both ends, a bifunctional (meth)acrylate compound, a polyfunctional thiol compound, a photo-radical generator and an organic solvent, and then the bifunctional (meth)acrylate compound contained in an amount of 5% to 50% by mass and the polyfunctional thiol compound is contained in an amount of 0.1% to 10% by mass, relative to the content of the polymer.

10 Claims, No Drawings

PHOTOSENSITIVE RESIN COMPOSITION AND ADHESIVES COMPOSITION

TECHNICAL FIELD

The present invention relates to a photosensitive resin composition for forming a moisture vapor transmission-preventing membrane for a solid-state imaging element such as a CMOS image sensor. Further, the present invention relates to an adhesive composition having properties in which adhesion is exerted before exposure and adhesion decreases due to curing after exposure.

BACKGROUND ART

A compact and inexpensive solid-state imaging element used in a video camera, a digital camera, or the like, has been known. For example, a cross-sectional view of the solid-state imaging element is disclosed in FIG. 1 of Patent Document 1. FIG. 1 illustrates that the circumference of a light-transmitting substrate 2 is sealed with a moisture impermeable resin 6 such as a water-repellent resin. Patent Document 1 describes that "as a color filter used in the solid-state imaging element, a color filter obtained by mixing a dye or a pigment in a gel, polyvinyl alcohol, or the like and applying the mixture is often used, but spectral properties are likely to be deteriorated by humidity and temperature. Therefore, prevention of entry of moisture is particularly required." Patent Document 1 further describes that "when the circumference of the light-transmitting substrate is sealed with a moisture impermeable resin having a moisture vapor transmission rate of several tens $g/m^2 \cdot 24$ hr or less, the lifetime of an element can be extended."

Patent Documents 2 and 3 disclose an adhesive composition to be cured in a short time by irradiation with ultraviolet light. The adhesive composition disclosed in Patent Document 2 contains a urethane (meth)acrylate-based resin [A] and an aliphatic or alicyclic alkyl (meth)acrylate [B]. Further, a photopolymerization initiator is added to the adhesive composition. The adhesive composition disclosed in Patent Document 3 contains a urethane (meth)acrylate-based resin [A] and an ethylenically unsaturated monomer [B]. Further, a photopolymerization initiator is added to the adhesive composition. Each adhesive sheet obtained from the adhesive compositions is bonded to a SUS polished substrate, and rolled by a 2-kg roller twice, and after 30 minutes, a 180° peeling test is performed, and the adhesion is evaluated.

PRIOR ART DOCUMENTS

Patent Documents

Patent Document 1: Japanese Patent Application Publication No. 2000-323692 (JP 2000-323692A)
Patent Document 2: Japanese Patent Application Publication No. 2002-309185 (JP 2002-309185 A)
Patent Document 3: Japanese Patent Application Publication No. 2004-143233 (JP 2004-143233 A)

SUMMARY OF THE INVENTION

Problem to be Solved by the Invention

In a membrane having adhesion to be used as an adhesive after exposure, it is considered that curing is insufficient. The resistance thereof to an organic solvent is also insufficient. During development, a part of the membrane is dissolved. For this reason, an upper part of a pattern to be formed after development is roundish, and is not rectangular. An object of the present invention is to provide a photosensitive resin composition in which the adhesion after exposure decreases by improving the curing properties, to express organic solvent resistance.

Means for Solving the Problems

The present invention is a photosensitive resin composition comprising a polymer having a repeating structural unit of the following Formula (1):

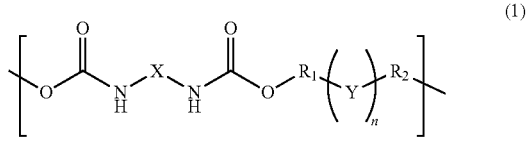

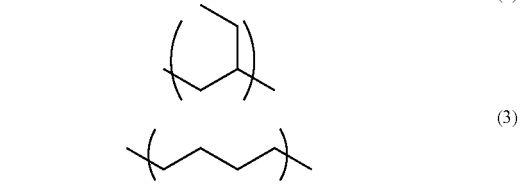

(wherein $R_1$ and $R_2$ are each independently a single bond, a methylene group, or an ethylene group, Y is an alkylene group of Formula (2) or a combination of the alkylene group of Formula (2) with an alkylene group of Formula (3), n is an integer of 1 to 110, and X is a divalent aliphatic hydrocarbon group, a divalent alicyclic hydrocarbon group, or a divalent aromatic hydrocarbon group), and a (meth)acryloyl group at both ends, a compound of the following Formula (4):

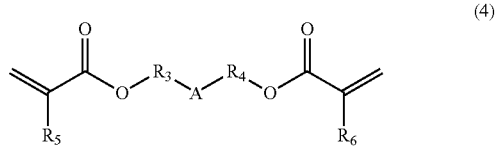

(wherein A is a divalent alicyclic hydrocarbon group, $R_3$ and $R_4$ are each independently a single bond, a methylene group, or an ethylene group, and $R_5$ and $R_6$ are each independently a hydrogen atom or a methyl group), a compound of the following Formula (5):

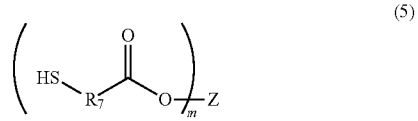

(wherein $R_7$ is a methylene group, an ethylene group, a propylene group, or a trimethylene group, m is an integer of 2 to 4, and Z is a $C_{4-9}$ organic group), a photo-radical generator, and an organic solvent, wherein the compound of Formula (4) is contained in an amount of 5% by mass to 50% by mass, and the compound of Formula (5) is contained in an amount of 0.1% by mass to 10% by mass, relative to the content of the polymer.

The photosensitive resin composition of the present invention is useful as a composition for forming a moisture vapor transmission-preventing membrane or an adhesive composition.

Effects of the Invention

A membrane formed from the photosensitive resin composition of the present invention has moisture vapor transmission which is sufficient for a moisture vapor transmission-preventing membrane of a solid-state imaging element. Further, the membrane has properties in which adhesion is exerted before exposure and adhesion decreases due to curing after exposure.

MODES FOR CARRYING OUT THE INVENTION

[Polymer]

The composition of the present invention contains a polymer having a repeating structural unit of Formula (1) and a (meth)acryloyl group at both ends. As the polymer, a hydrogenated polybutadiene-based urethane acrylate resin is preferably used. Examples thereof include UV-3630ID80 and UV-3635ID80 (all available from The Nippon Synthetic Chemical Industry Co., Ltd.).

The polymer may be used alone or two or more types thereof may be used in combination. For example, the polymer has a weight average molecular weight of 10,000 to 100,000.

[Compound of Formula (4)]

The composition of the present invention contains a bifunctional (meth)acrylate compound of Formula (4). Examples of the compound include tricyclodecane dimethanol diacrylate, tricyclodecane dimethanol dimethacrylate, tricyclodecane diethanol diacrylate, and tricyclodecane diethanol dimethacrylate.

The compound of Formula (4) is available as a commercial product. Examples thereof include A-DCP and DCP (all available from Shin Nakamura Chemical Co., Ltd.).

The compound of Formula (4) may be used alone or two or more types thereof may be used in combination.

The content of the compound of Formula (4) in the composition of the present invention is 5% by mass to 50% by mass, and preferably 10% by mass to 30% by mass, relative to the content of the polymer.

[Compound of Formula (5)]

The composition of the present invention contains a multifunctional thiol compound of Formula (5). Examples of the compound include pentaerythritol tetrakis(3-mercaptobutyrate), 1,4-bis(3-mercaptobutyryloxy)butane, 1,3,5-tris (3-mercaptobutyryloxyethyl)-1,3,5-triazine-2,4,6(1H,3H, 5H)-trione, trimethylolpropane tris(3-mercaptobutyrate), and trimethylolethane tris(3-mercaptobutyrate).

The compound of Formula (5) is available as a commercial product. Examples thereof include KarenzMT (registered trademark) PE1, BD1, and NR1 (all available from Showa Denko K.K.).

The content of the compound of Formula (5) in the composition of the present invention is 0.1% by mass to 10% by mass, and preferably 1% by mass to 5% by mass, relative to the content of the polymer.

[Photo-Radical Generator]

The composition of the present invention contains a photo-radical generator. The photo-radical generator is not particularly limited as long as it is a compound having an absorption property for a light source used during light curing. Examples thereof include organic peroxides such as tert-butylperoxy-iso-butyrate, 2,5-dimethyl-2,5-bis(benzoyldioxy)hexane, 1,4-bis[α-(tert-butyldioxy)-iso-propoxy] benzene, di-tert-butyl peroxide, 2,5-dimethyl-2,5-bis(tert-butyldioxy)hexene hydroperoxide, α-(iso-propylphenyl)-iso-propyl hydroperoxide, tert-butyl hydroperoxide, 1,1-bis (tert-butyldioxy)-3,3,5-trimethyl cyclohexane, butyl-4,4-bis (tert-butyldioxy)valerate, cyclohexanone peroxide, 2,2',5,5'-tetra(tert-butylperoxycarbonyl)benzophenone, 3,3',4,4'-tetra (tert-butylperoxycarbonyl)benzophenone, 3,3',4,4'-tetra (tert-amylperoxycarbonyl)benzophenone, 3,3',4,4'-tetra (tert-hexylperoxycarbonyl)benzophenone, 3,3'-bis(tert-butylperoxycarbonyl)-4,4'-dicarboxybenzophenone, tert-butyl peroxybenzoate, and di-tert-butyl diperoxyisophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl)benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butan-1-one; acylphosphine oxide-based compounds such as bis(2,4,6-trimethylbenzoyl)-phenyl phosphine oxide, and 2,4,6-trimethylbenzoyl-diphenyl-phosphine oxide; and oxime ester-based compounds such as 1-[4-(phenylthio)phenyl]-1,2-octanedione 2-(O-benzoyloxime) and 1-[9-ethyl-6-(2-methylbenzoyl)-9H-carbazol-3-yl]-ethanone-O-acetyloxime.

The photo-radical generator is available as a commercial product. Examples thereof include IRGACURE (registered trademark) 651, 184, 500, 2959, 127, 754, 907, 369, 379, 379EG, 819, 819DW, 1800, 1870, 784, OXE01, OXE02, 250, 1173, MBF, TPO, and 4265 (all available from BASF Japan Ltd.), KAYACURE (registered trademark) DETX, MBP, DMBI, EPA, and OA (all available from NIPPON KAYAKU Co., Ltd.), VICURE-10 and 55 (all available from STAUFFER Co. LTD), ESACURE KIP150, TZT, 1001, KTO46, KB1, KL200, KS300, and EB3, triazine-PMS, triazine A, and triazine B (all available from Nihon Siber-Hegner K.K.), and ADEKA Optomer N-1717, N-1414, and N-1606 (all available from ADEKA Corporation).

The photo-radical generator may be used alone or two or more types thereof may be used in combination.

The content of the photo-radical generator in the composition of the present invention is 0.1 phr to 30 phr, and preferably 1 phr to 20 phr, relative to the content of the polymer. When the content does not satisfy the lower limit, sufficient curing properties are not achieved. Herein, phr represents the mass of a photopolymerization initiator relative to a mass of the polymer of 100 g.

[Organic Solvent]

The composition of the present invention contains an organic solvent. The organic solvent is not particularly limited as long as it is capable of dissolving each component contained in the composition of the present invention.

Examples thereof include ketones such as cyclopentanone, cyclohexanone, methyl isoamyl ketone, 2-butanone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or dipropylene glycol monoacetate, and monomethyl ether, monoethyl ether, monopropyl ether, monobutyl ether, and monophenyl ether thereof; cyclic ethers such as dioxane; lactones such as γ-butyrolactone; and esters such as methyl lactate, ethyl lactate, methyl acetate, ethyl acetate, butyl acetate, methyl pyruvate, ethyl pyruvate, methyl methoxypropionate, ethyl ethoxypropionate, and methyl 2-hydroxyisobutyrate.

The organic solvent may be used alone or two or more types thereof may be used in combination.

A solid content defined as all components containing the components and other additives described below except for the organic solvent can be contained, for example, in an amount of 0.5% by mass to 95% by mass, and preferably 1% by mass to 90% by mass, relative to the composition of the present invention.

[Other Additives]

The composition of the present invention may contain an additive such as a monofunctional (meth)acrylate and a surfactant, if necessary, as long as the effects of the present invention are not impaired.

The monofunctional (meth)acrylate is a monomer having one (meth)acryloyl group. Examples thereof include isodecyl acrylate, isodecyl methacrylate, isostearyl acrylate, methoxypolyethylene glycol acrylate, 2-acryloyloxyethyl succinate, isostearyl methacrylate, methoxypolyethylene glycol methacrylate, and 2-methacryloyloxyethyl succinate.

The monofunctional (meth)acrylate is available as a commercial product. Examples thereof include NK ester AM-90G, A-SA, S-1800A, M-90G, S, and SA (all available from Shin Nakamura Chemical Co., Ltd.).

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

The surfactant is available as a commercial product. Examples thereof include fluorine-based surfactants such as Eftop (registered trademark) EF301, EF303, and EF352 (available from Mitsubishi Materials Electronic Chemicals Co., Ltd.), MEGAFACE (registered trademark) F-553, F-554, F-556, F-477, F171, F173, R-08, R-30, R-30N, R-40, and R-40-LM (available from DIC Corporation), FLUORAD FC430 and FC431 (available from Sumitomo 3M, Ltd.), trade name ASAHI GUARD (registered trademark) AG710, and SURFLON (registered trademark) S-382, SC101, SC102, SC103, SC104, SC105, and SC106 (available from Asahi Glass Co., Ltd.); and organosiloxane polymer KP341 (available from Shin-Etsu Chemical Co., Ltd.).

The composition of the present invention can be prepared by dissolving the polymer having a repeating structural unit of Formula (1) and a (meth)acryloyl group at both ends, the bifunctional (meth)acrylate compound of Formula (4), the polyfunctional thiol compound of Formula (5), and the radical generator in the organic solvent.

EXAMPLES

Hereinafter, the present invention will be described in more detail on the basis of Examples, and the present invention is not limited to these Examples.

In gel permeation chromatography (GPC) analysis of polymers obtained in Synthesis Examples described below, the following apparatus is used, and the measurement conditions are as follows.

Apparatus: integrated high-performance GPC system HLC-8220GPC manufactured by TOSOH CORPORATION
Column: KF-G, KF804L
Column Temperature: 40° C.
Solvent: tetrahydrofuran (THF)
Flow rate: 1.0 mL/min
Standard sample: polystyrene
Detector: RI Comparative Synthesis Example 1

55.00 g of 2,2-bis(4-glycidyloxycyclohexane)propane, 24.97 g of 1,2-cyclohexanedicarboxylic acid, and 1.40 g of benzyltriethylammonium chloride were dissolved in 189.88 g of cyclohexanone, and the mixture was reacted at 160° C. for 4 hours, and cooled to room temperature. In the reactant, 30.32 g of glycidyl methacrylate and 1.21 g of benzyltriethylammonium chloride were further dissolved, and the mixture was reacted at 160° C. for 3 hours to obtain a solution containing a polymer. The obtained polymer was analyzed by GPC. The weight average molecular weight in terms of standard polystyrene was 4,100. The obtained polymer is considered to be a polymer having a structural unit of the following Formula and a methacrylic group at an end of the polymer.

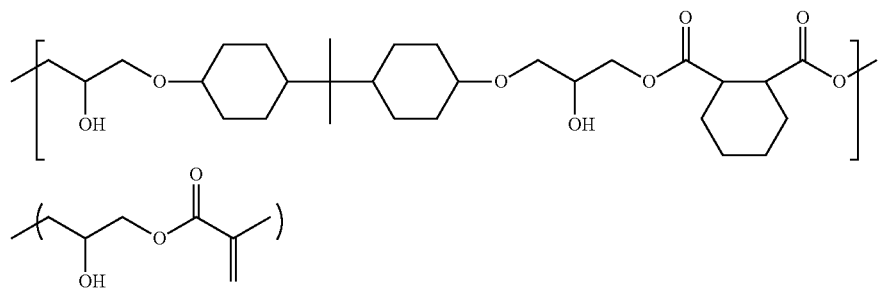

Example 1

38.00 g of UV-3630ID80 (available from The Nippon Synthetic Chemical Industry Co., Ltd.) being a hydrogenated polybutadiene-based urethane acrylate resin, 38.00 g of UV-3635ID80 (available from The Nippon Synthetic Chemical Industry Co., Ltd.) being a hydrogenated polybutadiene-based urethane acrylate resin, 3.80 g of IRGACURE184 (available from BASF Japan Ltd.), 11.40 g of tricyclodecane dimethanol diacrylate (available from Shin Nakamura Chemical Co., Ltd.), and 0.76 g of pentaerythritol tetrakis(3-mercaptobutyrate) (available from Showa Denko K.K.) were dissolved in 15.16 g of cyclohexanone to prepare a composition.

Example 2

23.00 g of UV-3635ID80 (available from The Nippon Synthetic Chemical Industry Co., Ltd.) being a hydrogenated polybutadiene-based urethane acrylate resin, 1.15 g of IRGACURE184 (available from BASF Ltd.), 2.30 g of tricyclodecane dimethanol diacrylate (available from Shin Nakamura Chemical Co., Ltd.), and 0.46 g of pentaerythritol tetrakis(3-mercaptobutyrate) (available from Showa Denko K.K.) were dissolved in 6.44 g of cyclohexanone to prepare a composition.

Comparative Example 1

50.00 g of the polymer solution obtained in Comparative Synthesis Example 1 (solid content: 65.91% by mass), 1.65 g of IRGACURE184 (available from BASF Ltd.), 4.94 g of tricyclodecane dimethanol diacrylate (available from Shin Nakamura Chemical Co., Ltd.), and 0.82 g of pentaerythritol tetrakis(3-mercaptobutyrate) (available from Showa Denko K.K.) were dissolved in 0.26 g of cyclohexanone to prepare a composition.

Comparative Example 2

90.00 g of UV-3630ID80 (available from The Nippon Synthetic Chemical Industry Co., Ltd.) being hydrogenated polybutadiene-based urethane acrylate resin, and 1.65 g of IRGACURE184 (available from BASF Ltd.) were dissolved in 16.12 g of cyclohexanone to prepare a composition.

[Moisture Vapor Transmission Rate Test]
JIS Z 0208 (Dish Method)

From the composition prepared in each of Example 1 and Comparative Example 1, a membrane was formed on Kapton film (available from DU PONT-TORAY CO., LTD.), pre-baked at 120° C., exposed to light (ghi line broad band, exposure dose: 3,000 mJ/cm$^2$) by an aligner (PLA-501, manufactured by Canon Inc.), then baked at 150° C., and developed in a mixed solution of cyclohexanone and 2-propanol, to obtain a target membrane. During the exposure, calcium chloride was put into a dish for measurement of moisture vapor transmission rate, and the obtained membrane was provided so that the membrane diameter was 6 cm. The initial total mass was measured. The dish was set in a constant temperature and humidity chamber of 40° C./60%, and the total mass after 24 hours was measured. The amount of increase in the mass of water was calculated. The moisture vapor transmission rate of the membrane was evaluated. The moisture vapor transmission rate of the membrane obtained from the composition in Example 1 was 35.2 g/m$^2$·day, and the moisture vapor transmission rate of the membrane obtained from the composition in Comparative Example 1 was 59.4 g/m$^2$·day. This shows that the former membrane has superior moisture vapor transmission-preventing properties.

[Tackiness Test 1]
JIS Z 0237 (Probe Tack Method)

From the composition prepared in each of Example 1 and Comparative Example 2, a membrane was formed on a silicon wafer, and pre-baked at 120° C. to obtain a target membrane. Each pre-baked membrane was exposed to light (ghi line broad band, exposure dose: 3,000 mJ/cm$^2$) by an aligner (PLA-501, manufactured by Canon Inc.), baked at 150° C., and developed in a mixed solution of cyclohexanone and 2-propanol, to obtain a target membrane. A cylindrical indenter was pushed against and pulled from each of the obtained four types of membranes. A tackiness test of measuring the adhesion stress at that time was carried out. As the test conditions, the test temperature was 23° C., the diameter of indenter shape was 2 mm, the testing speed was 50 mm/min, and the initial pressure was 1 MPa. An apparatus used in the test was a digital material tester (55R-5867, manufactured by INSTRON). The adhesion stress of the membrane obtained from the composition in Example 1 was 3.5 MPa before exposure, and 1.0 MPa after exposure and development. In contrast, the adhesion stress of the membrane obtained from the composition in Comparative Example 2 was 4.2 MPa before exposure, and 2.4 MPa after exposure and development. The results show that both the adhesion stresses of the membranes obtained from the compositions in Example 1 and Comparative Example 2 decreased after exposure and development, however, the ratio of decrease in adhesion stress of the former membrane due to exposure and development was higher, that is, the adhesion of the former membrane was the lowest.

[Tackiness Test 2]
JIS Z 0237 (180° Peeling Test)

From the composition prepared in each of Example 1 and Comparative Example 2, a membrane was formed on a silicon wafer, pre-baked at 120° C., exposed to light (ghi line broad band, exposure dose: 3,000 mJ/cm$^2$) by an aligner (PLA-501, manufactured by Canon Inc.), then baked at 150° C., and developed in a mixed solution of cyclohexanone and 2-propanol, to obtain a target membrane. The obtained two types of membranes were each processed into a tape shape with a width of 10 mm and a length of 10 cm, to obtain a sample. The sample processed into a tape shape was attached to a stainless plate having a polished surface using a pressing roller at a load of 1 kg. A force required to peel the sample in a direction of 180° was measured. The adhesion stress of the sample processed into a tape shape from the membrane which was obtained from the composition in Example 1 was 0.12 N/10 cm. In contrast, the adhesion stress of the sample processed into a tape shape from the membrane which was obtained from the composition in Comparative Example 2 was 0.44 N/10 cm. The results show that the adhesion of the sample processed into a tape shape from the membrane after exposure and development which is obtained from the composition in Example 1 is lower than that of the sample processed into a tape shape from the membrane after exposure and development which is obtained from the composition in Comparative Example 2.

INDUSTRIAL APPLICABILITY

The membrane formed from the photosensitive resin composition of the present invention has high moisture vapor transmission which is satisfied in a moisture vapor transmission-preventing membrane of a solid-state imaging element such as a CMOS image sensor. Therefore, the photosensitive resin composition of the present invention is useful as a composition for forming a moisture vapor transmission-preventing membrane of a solid-state imaging element. Since the photosensitive resin composition of the present invention after exposure has lower adhesion, the photosensitive resin composition is also useful as an excellent adhesive composition.

The invention claimed is:

1. A photosensitive resin composition comprising a polymer having a repeating structural unit of the following Formula (1):

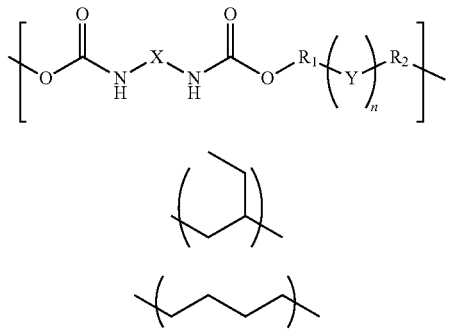

(wherein $R_1$ and $R_2$ are each independently a single bond, a methylene group, or an ethylene group, Y is an alkylene group of Formula (2) or a combination of the alkylene group of Formula (2) with an alkylene group of Formula (3), n is an integer of 1 to 110, and X is a divalent aliphatic hydrocarbon group, a divalent alicyclic hydrocarbon group, or a divalent aromatic hydrocarbon group) and a (meth) acryloyl group at both ends, a compound of the following Formula (4):

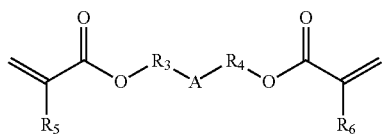

(wherein A is a divalent alicyclic hydrocarbon group, $R_3$ and $R_4$ are each independently a single bond, a methylene group, or an ethylene group, and $R_5$ and $R_6$ are each independently a hydrogen atom or a methyl group), a compound of the following Formula (5):

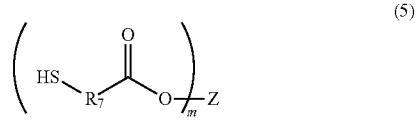

(wherein $R_7$ is a methylene group, an ethylene group, a propylene group, or a trimethylene group, m is an integer of 2 to 4, and Z is a $C_{4-9}$ organic group), a photo-radical generator, and an organic solvent, wherein the compound of Formula (4) is contained in an amount of 5% by mass to 50% by mass, and the compound of Formula (5) is contained in an amount of 0.1% by mass to 10% by mass, relative to the content of the polymer.

2. The photosensitive resin composition according to claim 1, wherein the polymer has a weight average molecular weight of 10,000 to 100,000.

3. The photosensitive resin composition according to claim 2, wherein the composition comprises at least two types of the polymers, and the two types of polymers have weight average molecular weights which are different from each other.

4. The photosensitive resin composition according to claim 1, wherein the compound of Formula (4) is tricyclodecane dimethanol di(meth)acrylate.

5. The photosensitive resin composition according to claim 1, wherein the compound of Formula (4) is contained in an amount of 10% by mass to 30% by mass relative to the content of the polymer.

6. The photosensitive resin composition according to claim 1, wherein the compound of Formula (5) is pentaerythritol tetrakis(3-mercaptobutyrate).

7. The photosensitive resin composition according to claim 1, further comprising a monomer having a (meth) acryloyl group.

8. The photosensitive resin composition according claim 7, wherein the monomer is isodecyl (meth)acrylate.

9. The photosensitive resin composition according to claim 1, which is for forming a moisture vapor transmission-preventing membrane.

10. The photosensitive resin composition according to claim 1, which is an adhesive composition.

* * * * *